(12) United States Patent
Lin (10) Patent No.: US 7,226,706 B2
(45) Date of Patent: Jun. 5, 2007

(54) MODIFICATION OF MASK BLANK TO AVOID CHARGING EFFECT

(75) Inventor: Cheng-ming Lin, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 304 days.

(21) Appl. No.: 10/441,888

(22) Filed: May 20, 2003

(65) Prior Publication Data

US 2004/0234868 A1 Nov. 25, 2004

(51) Int. Cl.
*G03F 1/00* (2006.01)
*G03C 5/00* (2006.01)

(52) U.S. Cl. .......................... 430/5; 430/311; 430/312; 430/313

(58) Field of Classification Search ................ 430/5, 430/311, 312, 313
See application file for complete search history.

(56) References Cited

U.S. PATENT DOCUMENTS

| | | | |
|---|---|---|---|
| 3,877,810 A | 4/1975 | Feldstein | |
| 4,411,972 A | 10/1983 | Narken | |
| 5,770,336 A | 6/1998 | Choi | |
| 5,912,468 A * | 6/1999 | Hirano et al. | 250/492.2 |
| 6,162,564 A | 12/2000 | Hieda | |
| 6,365,303 B1 | 4/2002 | Hung | |
| 6,624,430 B2 * | 9/2003 | Higuchi | 430/5 |
| 6,635,393 B2 * | 10/2003 | Pierrat | 430/5 |
| 6,841,346 B1 * | 1/2005 | O'Connell et al. | 435/5 |

* cited by examiner

*Primary Examiner*—Geraldina Visconti
(74) *Attorney, Agent, or Firm*—Duane Morris LLP (57) ABSTRACT

A blank mask for photomasking patterns on an integrated circuit comprises a non-conductive substrate and a layer of conductive material deposited on the substrate covering substantially the entire surface of said substrate. Methods for preventing charge accumulation on a non-conductive region of a mask, which is not covered by a layer of conductive material, are provided. One method comprises controlling electron beams to prevent the beams from striking an outer region for an area more than 90 percent of the outer region when patterning a predetermined feature on the mask. The outer region comprises an area beginning from an edge of the mask and ending at 2 to 6 mm inward from the edge. Another method comprises using a blocker to prevent electron beams from hitting the outer region for an area more than 90 percent of the outer region when patterning a predetermined feature on the substrate.

10 Claims, 7 Drawing Sheets

FIG. 6 ns in the fabrication of semiconductor devices, such as integrated circuits, masks are used to transfer patterns to semiconductor substrates. Masks can be illuminated with wide variety of radiation sources. For example, visible, ultraviolet, and deep ultraviolet illumination sources can be employed. Typical masks comprise a transparent mask substrate, and a means to form a pattern on the mask. Mask substrates made of such as glass or quartz have good dimensional stability and transmission properties for the wavelengths of various exposing radiations. Traditionally, a layer of chrome containing material that blocks radiation from transmitting to a semiconductor substrate is formed on the transparent mask substrate to generate a pattern which is transferred to a semiconductor substrate during the photolithographic process.

In an attenuated phase shifting mask, a layer of phase shifting material that can also reduce transmitting radiation such as molybdenum silicide is deposited on a mask substrate to form a pattern. In a chromeless phase shifting mask, a pattern is formed by etching the mask substrate or adding a transparent phase shifting material to create regions where transmitted radiations have a phase shift of 180 degrees from radiations transmitted through the mask substrate.

One ultimate goal of masks is to accurately transfer a predetermined pattern to semiconductor substrates. To achieve the goal, the predetermined pattern must be first formed on a mask. Regardless of different means employed to form a pattern on a mask substrate, mask manufacturing technology primarily typically comprises forming a photoresist layer on a mask substrate, patterning the photoresist layer by a radiation source, and transferring the pattern on the photoresist layer to a means of forming a pattern on the mask. For a traditional chrome mask, the pattern on the photoresist layer is transferred to the chrome layer that blocks incident radiation to form the pattern. For an attenuated phase shifting mask, the pattern on the photoresist layer is transferred to a layer of phase shifting material that shifts the phase of incident radiation 180 degrees and reduces its intensity. For a chromeless phase shifting material, the pattern on the photoresist layer is transferred to either a mask substrate by etching or to a layer of transparent phase shifting material that reverses the phase of incident radiation 180 degrees.

Various exposing resources such as a laser or an electronic beam can be used to manufacture a mask. When an electronic beam is employed to pattern a photoresist layer, a charging effect distorts the predetermined pattern to be formed on the mask substrate because a mask substrate comprises non-conductive materials such as glass and quartz. To solve the problem, a layer of conducting material is added under a photoresist layer and above the mask substrate to absorb electrons hitting and transmitting the photoresist layer. However, due to some manufacturing reasons, a conducting layer does not fully cover the surface of a mask substrate. Thus, a charging effect occurs around the outer region of the mask substrate. The outer region comprises the non-conductive region and an adjacent portion of the conductive layer which is also adversely affected by the charging effect. Patterns on the outer region are then distorted.

Figure 1:
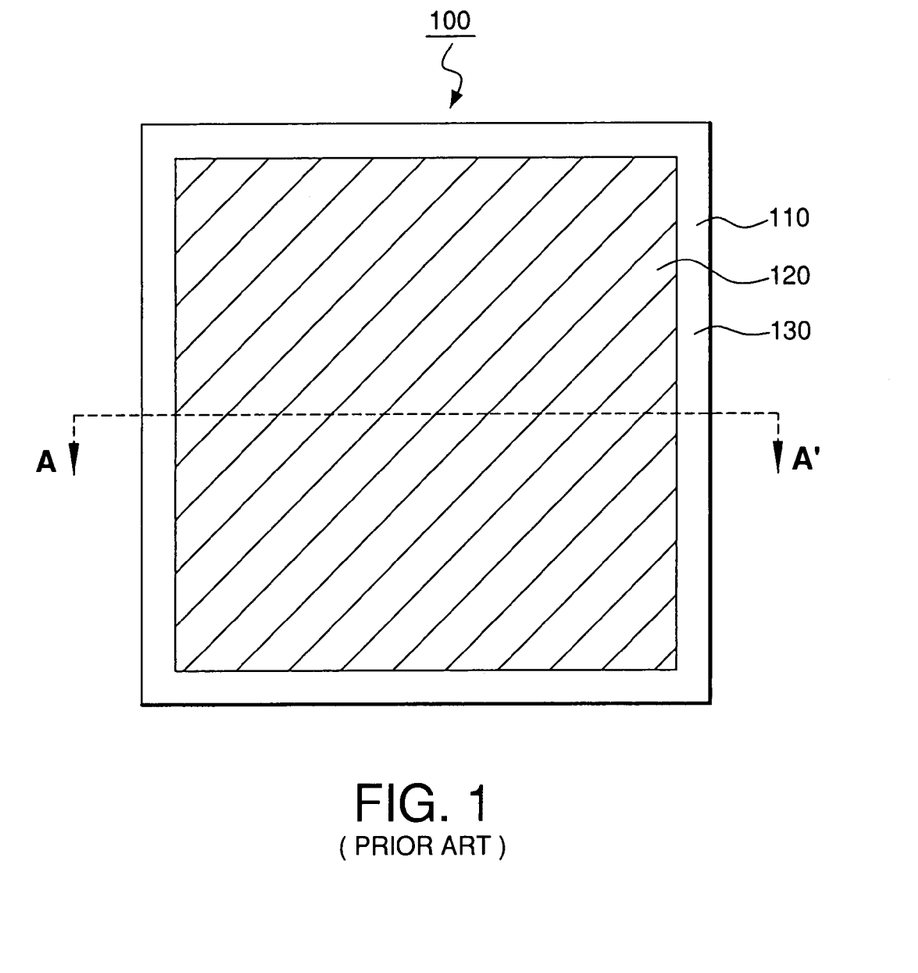
FIG. 1 (prior art) illustrates a top view of a conventional mask.
Figure 2A:
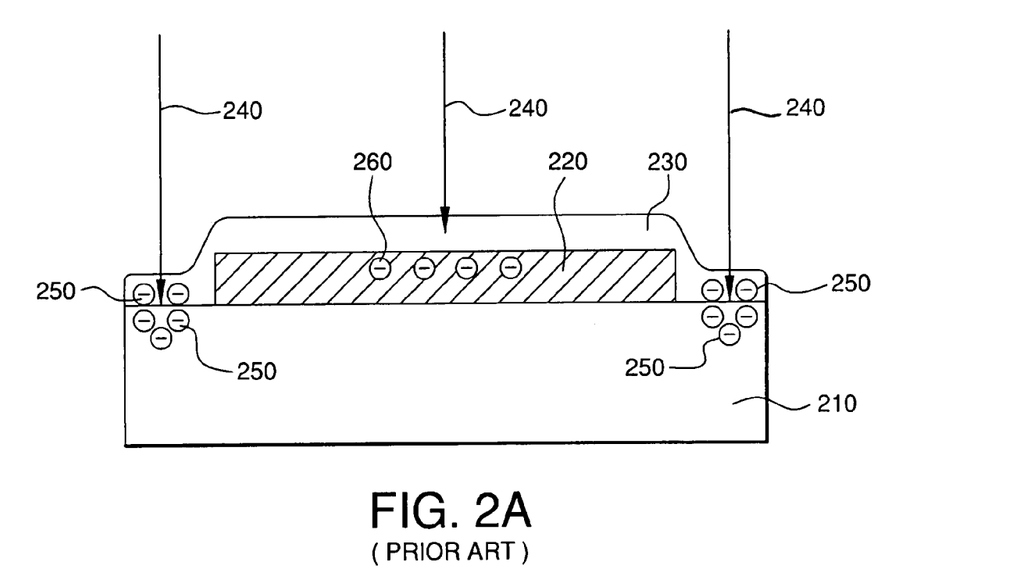
FIG. 2A (prior art) illustrates a cross-sectional view of FIG. 1 from line AA'.
Figure 2B:
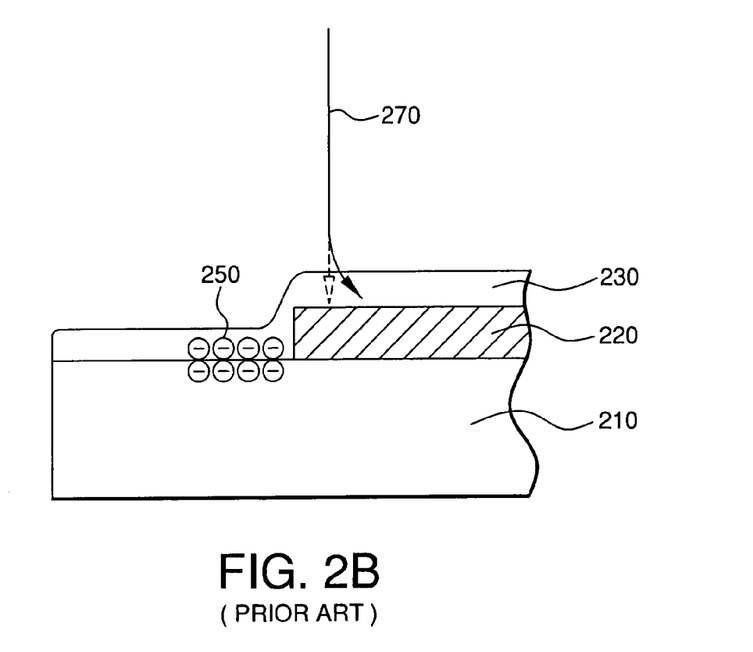
FIG. 2B (prior art) illustrates an amplified partial view of FIG. 2A to show a charging effect.

As shown in FIG. 1, a conventional mask 100 has a mask substrate 110 covered by a layer of chrome 120 and leaving a non-conductive region 130 uncovered. Turning to FIG. 2A, a cross-sectional view of the conventional mask 100, a photoresist layer 230 is formed on a chrome layer 220 and a mask substrate 210. The substrate 210 comprising glass or quartz is not conductive to electrons. Electron beams 240 are used to pattern the photoresist layer 230. Some electrons are absorbed by the photoresist layer 230 and change its solubility. Other electrons arrive and hit the surface of the chrome layer 220 and the substrate 210. Electrons 260 hitting the surface of the chrome layer 220 are conducted away to a ground. Electrons 250 hitting the non-conductive region of the substrate 210 accumulate on the surface and cause charging effect because the chrome layer 230 does not entirely cover the substrate 210. As shown in FIG. 2B, the accumulated electrons 250 cause an electron beam 270 incident to the surrounding area to drift and deviate away from its original path. Consequently, the predetermined pattern is distorted.

SUMMARY OF THE INVENTION

A blank mask for photomasking patterns on an integrated circuit comprises a non-conductive substrate and a layer of conductive material deposited on the substrate covering substantially the entire surface of said substrate. Methods for preventing charge accumulation on a non-conductive region of a mask, which is not covered by a layer of conductive material, are provided. One method comprises controlling electron beams to prevent the beams from striking an outer region for an area more than 90 percent of the outer region when patterning a predetermined feature on the mask. The outer region comprises an area beginning from an edge of the mask and ending at 2 to 6 mm inward from the edge. Another method comprises using a blocker to prevent electron beams from hitting the outer region for an area more than 90 percent of the outer region when patterning a predetermined feature on the substrate.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION

Figure 3A:
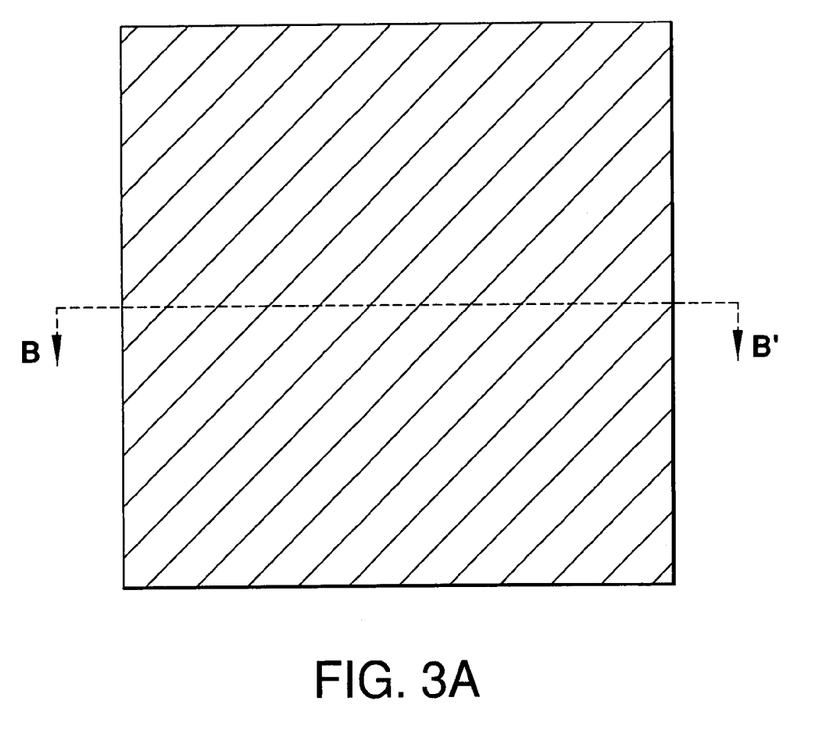
FIG. 3A illustrates a top view of a mask entirely covered by a layer of conducting material.
Figure 3B:
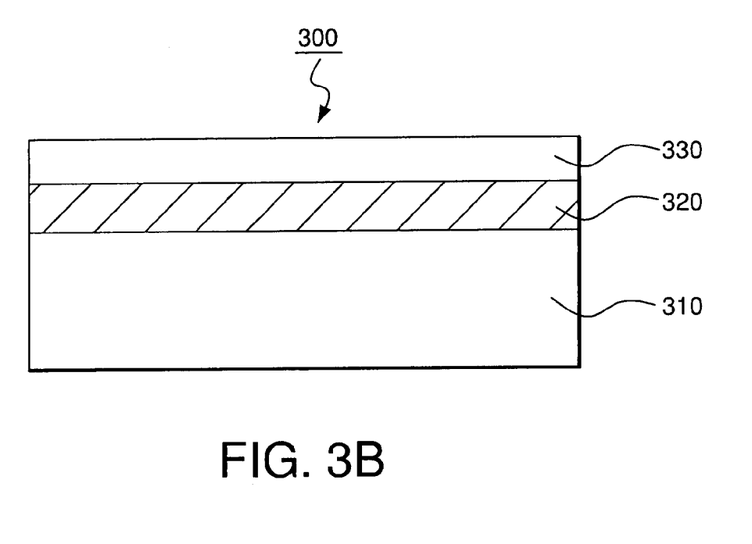
FIG. 3B illustrates a cross-sectional view of FIG. 3A from line BB'.

As shown in FIG. 3A and 3B, an embodiment of a mask 300 to avoid charging effects comprises a mask substrate 310 and a layer of conductive material 320 formed on the substrate 310 and substantially covering the entire area of the substrate. The mask substrate 310 comprises glass or quartz. The conductive layer 320 comprises chrome. In addition, the conductive layer 320 need not be formed directly on the top of the substrate 310. However, in order for the conductive layer 320 to absorb and conduct away electrons hitting and transmitting a photoresist layer 330, the conductive layer 320 is disposed directly under the photoresist layer 330. The layer of conductive material 320 is deposited directly or indirectly on the substrate 310 by, for example, physical vapor deposition (PVD) or chemical vapor deposition (CVD). If chrome is used as the conductive material, the thickness of the conductive layer 320 generally is about 500–1500 angstroms. A layer of photoresist material is disposed on the surface of a conductive layer 320 for example by sputtering. The layer of photoresist material 330 comprises positive photoresist or negative photoresist.

Figure 3C:
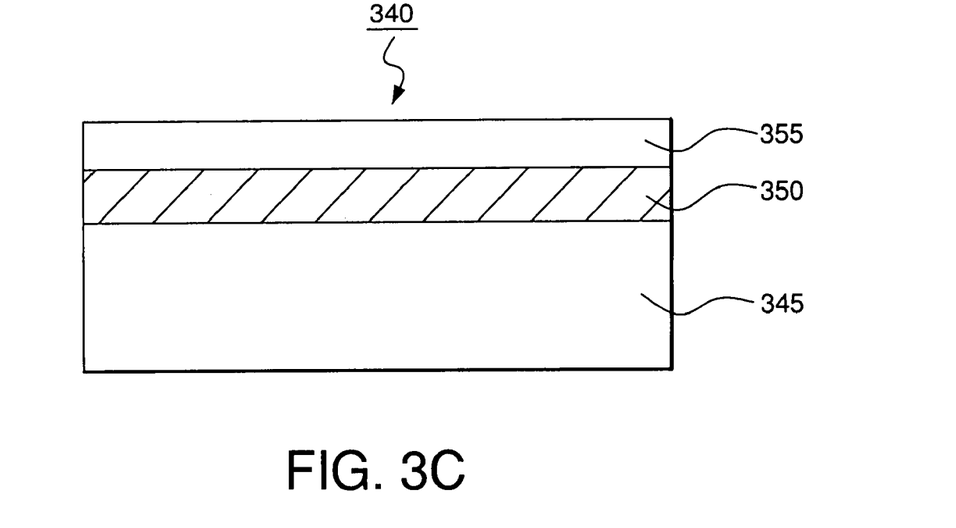
FIG. 3C illustrates a cross-sectional view of a chrome mask.
Figure 3D:
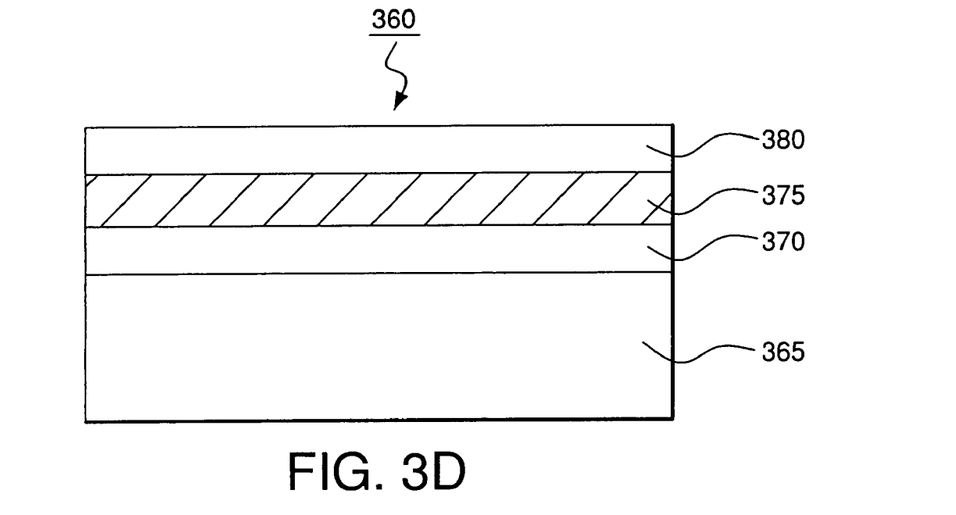
FIG. 3D illustrates a cross-sectional view of an attenuated phase shifting mask.

The size of the substrate can range from 6 inches to 12 inches. The shape of the substrate can be square, rectangular, or circular. The mask can be a chrome mask 340, an attenuated phase shifting mask 360, or a chromeless phase shifting mask.

In one embodiment of a chrome mask 340, as shown in FIG. 3C, a predetermined pattern is formed on the mask in a chrome layer 350. The chrome layer 350 has two functions. One function is, in a photolithographic process, to shield incident radiation to form dark areas on a semiconductor substrate because chrome is opaque to the incident radiation. The other function is to absorb and conduct away electrons hitting and transmitting a photoresist layer 355 during the course of creating the pattern on the mask 340 because chrome is a conductive material. Thus, the chrome layer 350 can also be used to avoid charging effect.

To form the predetermined pattern on the chrome mask 340, the chrome layer 350 is formed on and entirely covers the surface of the substrate 345. The photoresist layer 355 is then formed on the chrome layer 350. An electron gun is programmed to form the predetermined pattern on the photoresist layer 355. Because the chrome layer 350 fully covers the surface of the substrate 345, the predetermined pattern is accurately formed on the photoresist layer 355 without any charging effect. After development, the chrome layer 350 is etched to transfer the predetermined pattern from the photoresist layer 355 to the chrome layer 350. The remainder of the photoresist material 355 is then removed to complete the fabrication of the mask.

In another embodiment of an attenuated phase shifting mask 360, as shown in FIG. 3D, a layer of phase shifting material 370 such as molybdenum silicide is formed on the top of a mask substrate 365 and under a conductive layer 375. A photoresist layer 380 is then deposited on the conductive layer 375. The photoresist layer 380 is exposed by electron beams to form a predetermined pattern. All electrons hitting and passing the photoresist layer 380 are absorbed by the conductive layer 375. No charges accumulate to repel electron beams and cause a distortion of the pattern. After developing the photoresist layer 380, the conductive layer 375 is then etched to transfer the predetermined patterned formed on the photoresist layer 380 by exposure and development onto the conductive layer 375. The remaining photoresist layer 380 is removed. The layer 370 of molybdenum silicide is etched to further transfer the pattern formed on the conductive layer 375 to the layer of molybdenum silicide 370. The remainder of the conductive layer 375 is removed. The pattern of the molybdenum silicide layer 370 on the mask substrate 365 shifts the phase of incident radiation 180 degrees and reduces the intensity of incident radiation.

Charging effects can be avoided by employing a mask entirely covered by a conductive material. However, as shown in FIG. 1, when a traditional mask 100 which is not entirely covered by a conductive material is used, charging effect may occur. To avoid the severe charging effect, an outer region, that is defined as an area beginning from an edge of a mask and ending at about 2–6 mm inward from the edge, should not be hit by electron beams for more than 90%. Perfectly, the outer region should not be hit by electron beams at all but it is acceptable if the outer region is not hit by electron beams for more than 90%. Some methods can be taken to achieve this goal. In one embodiment, an electron gun is programmed to keep electron beams from scanning and hitting the outer region of the mask for more than 90%. In another embodiment, a blocker disposed between an electron gun and the mask can be used to bar electron beams from hitting more than 90% of the outer region.

Figure 4:
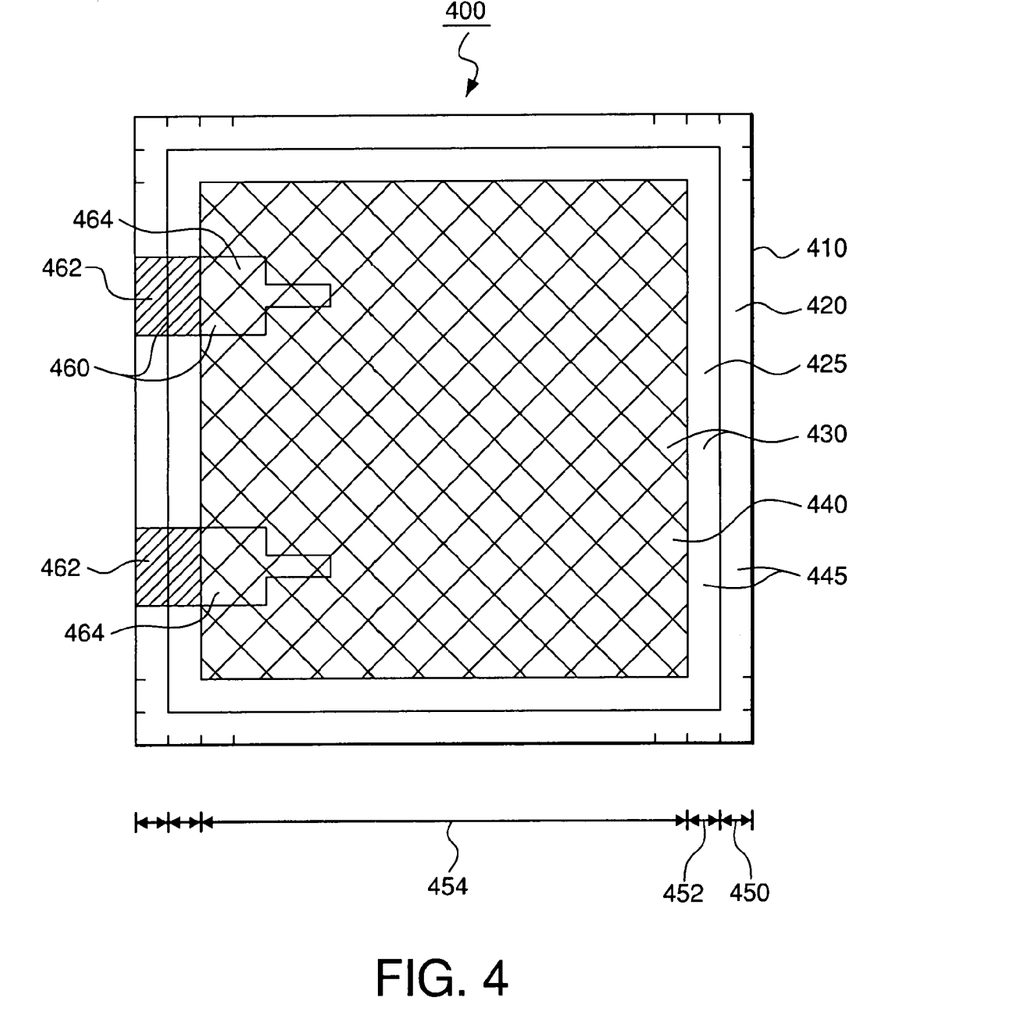
FIG. 4 illustrates a top view of a mask with a predetermined pattern.

As shown in FIG. 4, a mask 400 comprises an outer region 445 and an inner region 440. In this embodiment, the outer region 445 is an area beginning from an edge of the mask 400 and ending at about 4 mm inward from the edge. The outer region 445 has a non-conductive portion 420 which begins from the edge of the mask 400 to about 2 mm inward from the edge, and a conductive portion 425 which begins from about 2 mm inward from the edge to about 4 mm inward from the edge. The inner region 440 is covered by conductive material. Mostly, a portion of the outer region is covered by conductive material and the remaining portion of the outer region is left uncovered. Taking a 6 inches mask as an example, an outer region can be from edges of a mask to about 2 mm inward from the edge, having the inner 1 mm portion covered by conductive material and the outer 1 mm portion left blank. However, in an alternate embodiment, an outer region may contain a non-conductive region only.

Figure 5:
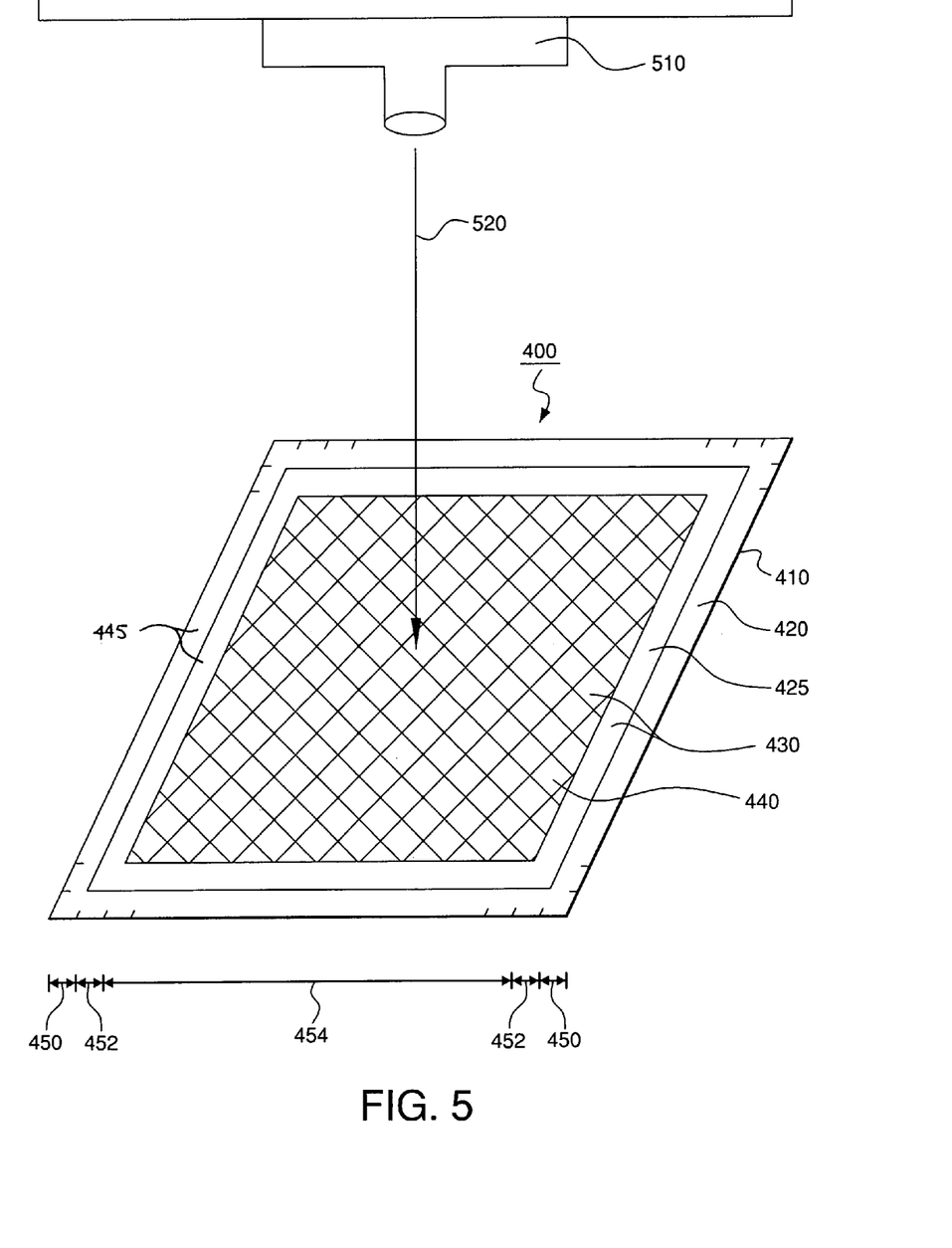
FIG. 5 illustrates an exposure system where electron beams are controlled not to hit an outer region of a mask shown in FIG. 4.

Under a perfect situation, the outer region 445 is not hit by electron beams at all. A predetermined pattern 460 comprises an outer segment 462 and an inner segment 464. To completely avoid charging effect, as shown in FIG. 5, an electron gun 510 is programmed to write on the inner region 440. As a result, the inner segment 464 of the predetermined pattern 460 is exposed by electron beams, but not the outer segment 462.

However, a distortion of a predetermined pattern caused by charging effect does not have a significant adverse effect unless electron beams write on more than 90 percent of the area of the outer region 445. In other words, in some embodiments, electron beams are controlled to prevent them from hitting more than 90 percent area of an outer region. For example, when the electron gun 510 is programmed to prevent the electron beams from writing on more than 90 percent of the area of the outer region 445, the pattern 460 formed on a photoresist layer is acceptable although it is possible that some outer segments 462 of the pattern 460 are slightly distorted due to a charging effect.

Figure 6:
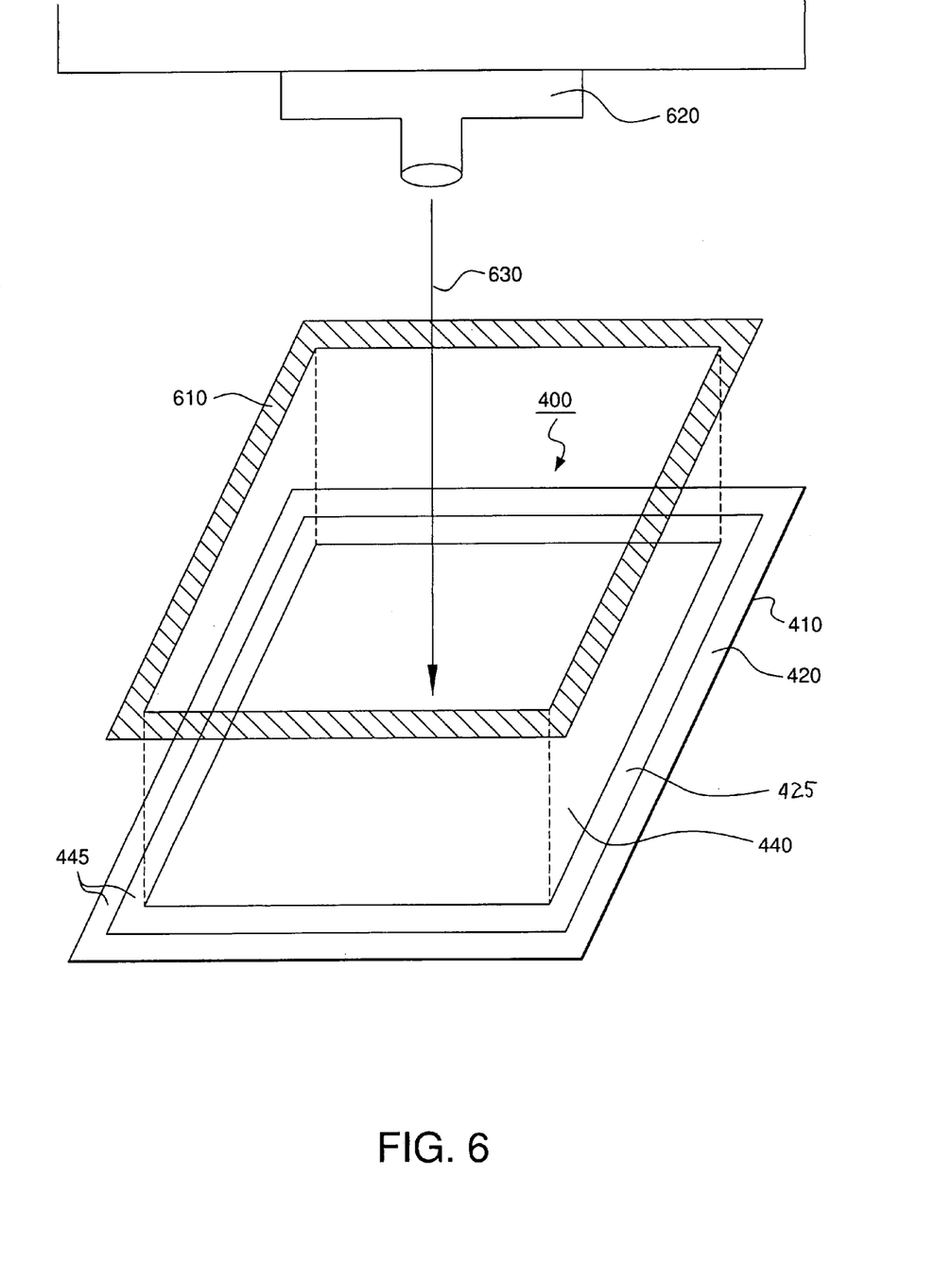
FIG. 6 illustrates an exposure system where a blocker prevents electron beams from hitting an outer region of a mask shown on FIG. 4.

As shown in FIG. 6, another method to prevent a charging effect is to use a blocker 610 to block electron beams 630 from hitting the outer region 445. In some embodiments, the blocker 610 can be made of conductive materials. The blocker 610 can be disposed anywhere along the path of the electron beams between the electron gun 620 and the mask 400. Charging effect can be completely avoided when the blocker 610 prevents electron beams from hitting the outer region 445. However, the blocker 610 can still effectively reduce adverse charging effect and the pattern on a photoresist layer is acceptable as long as the blocker 610 can prevent more than 90 percent area of the outer region 445 from being hit by electron beams 630.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for preventing charge accumulation on an outer region of a mask, comprising:

controlling electron beams to prevent the beams from hitting said outer region for an area more than 90 percent of said outer region when patterning a predetermined pattern on said mask, said outer region comprising an area beginning from an edge of said mask and ending approximately at 2 to 6 mm inward from said edge, wherein said controlling comprises programming an electron gun to prevent said electron beams from hitting said outer region for an area more than 90 percent of said outer region.

2. The method of claim 1 wherein electron beams do not hit said outer region when patterning a predetermined pattern on said mask.

3. The method of claim 1 wherein positive photoresist is used when patterning a predetermined pattern on said mask.

4. A mask is manufactured by the method of claim 1.

5. A method for preventing charge accumulation on an outer region of a mask, comprising:

providing said mask in which said outer region is void of conductive material; and using a blocker to block electron beams thereby preventing said electron beams from hitting said outer region for an area more than 90 percent of said outer region when patterning a predetermined pattern on said mask and thereby preventing charge accumulation at said outer region, said outer region comprising an area beginning from an edge of said mask and ending approximately at 2 to 6 mm inward from said edge, said blocker not biased to create an electric field that influences a path of said electron beams.

6. The method of claim 5 wherein said blocker prevents electron beams from hitting said outer region when patterning a predetermined pattern on said mask.

7. The method of claim 5 wherein positive photoresist is used when patterning a predetermined pattern on said mask.

8. A mask manufactured by a method of claim 5.

9. The method of claim 5 wherein said blocker is formed of a conductive material and disposed between an electron gun and said mask.

10. The method of claim 1 wherein said outer region is void of a conductive material.

* * * * *

UNITED STATES PATENT AND TRADEMARK OFFICE
CERTIFICATE OF CORRECTION

PATENT NO. : 7,226,706 B2
APPLICATION NO. : 10/441888
DATED : June 5, 2007
INVENTOR(S) : Cheng-ming Lin It is certified that error appears in the above-identified patent and that said Letters Patent is hereby corrected as shown below:

Column 6, line 23, delete "pattem" and insert therefore -- pattern --.

Signed and Sealed this

Twenty-third Day of October, 2007

JON W. DUDAS
*Director of the United States Patent and Trademark Office*